United States Patent
Buynoski

[11] Patent Number: 5,970,330
[45] Date of Patent: Oct. 19, 1999

[54] METHOD OF MAKING FIELD EFFECT TRANSISTOR WITH HIGHER MOBILITY

[75] Inventor: Matthew S. Buynoski, Palo Alto, Calif.

[73] Assignee: Advanced Micro Services, Inc., Sunnyvale, Calif.

[21] Appl. No.: 08/975,945

[22] Filed: Nov. 21, 1997

Related U.S. Application Data

[62] Division of application No. 08/626,340, Apr. 2, 1996, Pat. No. 5,729,045.

[51] Int. Cl.$^6$ .................................................. H01L 21/336
[52] U.S. Cl. ........................... 438/198; 438/462; 438/973
[58] Field of Search .................................. 438/168, 187, 438/198, 462, 973, 975, 982

[56] References Cited

U.S. PATENT DOCUMENTS

| | | | |
|---|---|---|---|
| 3,612,960 | 10/1971 | Takeishi et al. | 257/627 |
| 4,558,509 | 12/1985 | Tiwari | 438/168 |
| 4,857,986 | 8/1989 | Kinugawa | 257/369 |
| 4,933,298 | 6/1990 | Hasegawa | 438/198 |
| 4,971,926 | 11/1990 | Kinugawa | 438/973 |
| 5,171,703 | 12/1992 | Lin et al. | 438/198 |
| 5,192,680 | 3/1993 | Naruse et al. | 438/975 |
| 5,386,135 | 1/1995 | Nakazato et al. | 257/369 |
| 5,416,736 | 5/1995 | Kosa et al. | 257/380 |
| 5,698,893 | 12/1997 | Perera et al. | 438/198 |

FOREIGN PATENT DOCUMENTS

| | | | |
|---|---|---|---|
| 53-27371 | 3/1978 | Japan | 257/627 |
| 60-240126 | 11/1985 | Japan . | |

OTHER PUBLICATIONS

Wolf Ph.D., Stanley and Tauber, Ph.D., Richard N.; Chapter 1, "Silicon: Single Crystal Growth and Wafer Preparation"; Silicon Processing for The VLSI Era; vol. 1: *Process Technology*; pp. 1–35; 1986.

"Deep–Submicrometer Large–Angle–Tilt Implanted Drain (LATID) Technology", Takashi Hori, et al., IEEE Transacations on Electron Devices, vol. 39, No. 10, pp. 2312–2324, Oct. 1, 1992.

*Primary Examiner*—Chandra Chaudhari
*Attorney, Agent, or Firm*—Foley & Lardner

[57] ABSTRACT

A method of increasing the performance of an FET device by aligning the channel of the FET with the [110] crystal direction of a {100} silicon wafer. The {100} silicon wafer and the image of a lithographic mask are rotated 45° relative to each other so that, instead of the channel being aligned parallel with the [100] crystal direction in the conventional fabrication, the channel is aligned approximately parallel with the [110] crystal direction. The mobility of the carriers is higher in the [110] crystal direction thereby increasing the performance of the FET with only a minor modification in the lithographic process. The novel FET results with its channel aligned approximately parallel with the [110] crystal direction.

20 Claims, 2 Drawing Sheets

METHOD OF MAKING FIELD EFFECT TRANSISTOR WITH HIGHER MOBILITY

This is a Divisional of Ser. No. 08/626,340 filed on Apr. 2, 1996 and now U.S. Pat. No. 5,729,045.

FIELD OF THE INVENTION

The present invention relates to a field effect transistor and, more specifically, a field effect transistor (FET) with a channel between its source and drain having higher mobility carriers, and a method of fabricating such field effect transistor.

BACKGROUND OF THE INVENTION

With higher levels of integrated circuits on semiconductor chips and the need for faster transistors in these circuits, the FET transistor must maximize all aspects of semiconductor physics to fabricate transistors in these circuits with faster switching speed.

In crystalline solids, such as monocrystalline silicon, the atoms which make up the solid are spatially arranged in a periodic fashion. This periodic arrangement of atoms in a crystal is called a lattice. The crystal lattice always contains a volume which is representative of the entire lattice and it is regularly repeated throughout the crystal. The directions in a lattice are expressed as a set of three integers with the same relationship as the components of a vector in that direction. The three vector components are given in multiples of the basic vectors. For example, in cubic lattices, such as silicon which has a diamond crystal lattice, the body diagonal has the components of 1a, 1b, and 1c and this diagonal exist along the [111] direction with the [ ] brackets being used to denote a specific direction. However, many directions in a crystal are equivalent, depending on the arbitrary choice of orientation of the axes. Such equivalent directions are denoted with < > brackets and, for example, crystal directions in the cubic lattice [100], [010], and [001] are all crystallographically equivalent and are <100> directions. Since these directions will also be on the negative side of the origin, as arbitrarily defined, they also are identified with a (-) over the specific negative integer, such as [1̄00], [01̄0], and [001̄] for <100> directions. Unless specifically stated or shown in the following description in this application, a crystal direction includes both positive and negative integers.

Planes in a crystal also can be determined with a set of three integers h, k, and l. They are used to define a set of parallel planes and each set of three integers in ( ) parentheses identify a specific plane. As in the case of directions, many planes in a lattice are equivalent and the indices of such equivalent planes are denoted by { } parentheses. For cubic lattices, direction [k,l,m] is perpendicular to a plane with the identical three integers (k,l,m). Thus, if either a direction or a plane of a cubic lattice is known, its perpendicular counterpart can be quickly determined without calculation. For example, for planes of equivalent symmetry such as {100} plane, the equivalent planes are (100), (010), (001), (1̄00), (01̄0), and (001̄). Like the crystal direction, the crystal plane in the following description in this application includes both positive and negative integers unless specifically stated otherwise.

Today, almost all FET transistors are fabricated using {100} silicon wafers because the smallest surface state densities are present with such crystal orientations. The {100} crystal orientations is found using x-ray to examine a boule of silicon and to produce a Laue photograph. With this information, a primary flat is ground on the silicon boule to precisely identify the {100} crystal orientations. After the boule is sliced into thin wafers, the flat is used for establishing the {100} crystal orientation during the fabrication of integrated circuits, including FETs, in the individual chips after the wafer is diced. Each wafer is etched with an identification number which includes the dopant species and the crystal growth orientation. In manufacturing the FET with the source and drain separated by the gate and having a channel thereunder, the flat permits alignment of the wafer relative to the exposure masks so that the gate width and the channel length thereunder will be parallel with [100] crystal direction and orthogonal with (100) crystal plane.

Another crystal direction in the {100} silicon wafer is [110] and it is known to have higher mobility than a [100] crystal directions in the {100} silicon wafer. When an electric field is applied to semiconductor body such as silicon, each of the carriers, such as electrons, in the body will experience a force from the field and will be accelerated along the field in the opposite direction of the field. This is called drift velocity and it is proportional to the applied electric field. This proportionality factor is known as mobility and it varies based on a number of factors including the crystal direction of the semiconductor body, such as silicon. From experiments, it has been found that the mobility of the carriers in {100} silicon in the [110] direction is higher than the [100] direction by about 5 percent depending on the doping concentration of the silicon. However, silicon in [100] crystal direction has better cleavage than silicon in [110] crystal direction and breaks cleaner along scribe lines so that the chips do not fracture during dicing. Thus, for the ease in manufacturing, it has been the preferred crystal direction in the fabrication of integrated circuits in silicon wafers.

SUMMARY OF THE INVENTION

Accordingly, it is an object of the present invention to provide a FET transistor which utilizes the higher mobility of [110] crystal direction in {100} silicon and thus is faster in switching speed.

Another object of the present invention is to provide a {100} silicon wafer but with FET devices orientation on the {100} wafer so that current flows in either [110] directions but is capable of being diced without fracturing the chips.

A further object of the present invention is to permit current flow in the FET channel along [110] direction of a {100} silicon wafer with minimal change in manufacturing equipment.

In accordance with the present invention, a standard silicon wafer with a primary flat of {100} orientation is used and, before exposure to an image by a lithographic exposure apparatus, the relative relationship between the mask and the {100} silicon wafer is changed so that the relationship, in the same plane, is approximately forty-five degrees (45°) from the normal relationship in the same plane. Thus, the [110] crystal direction is aligned approximately perpendicular to the gate width and will be aligned parallel with channel length direction when voltage is applied to the gate. This 45° change is accomplished by either modifying the mask holder or the wafer holder of an optical lithographic system so the mask holder and the wafer holder are in a relationship of approximately forty-five degrees (45°) from their normal relationship using the [100] crystal direction. The target of the relationship change is exactly 45°, assuming the flat of {100} wafer is precise, because the mobility of the carriers in channel will be optimum when the channel and [110]

crystal direction are parallel. However, due to slight imperfection of the lithographic apparatus wafer and mask holders, the change may vary by ±2% of the 45° change. The remaining fabrication steps, such as implantation, plasma or anisotropic etching, oxidation, chemical vapor deposition, sputtering and planization, are performed without any modification of the wafer holders, because the exposed surface of the silicon wafer to these processes remains in the [100] direction.

Another aspect of the present invention is a novel FET with its gate formed perpendicular to the [110] crystal direction so that the channel will be parallel with this direction with a voltage applied to the gate. Thus, the carriers, such as electrons, in the channel of the FET will have a higher drift velocity or mobility due to alignment with the [110] crystal direction and the FET will be faster than a conventional one with the channel aligned with a [100] crystal direction.

BRIEF DESCRIPTION OF THE DRAWINGS

The foregoing and other objects, aspects and advantages will be better understood from the following detailed description of a preferred embodiments of the invention with reference in the drawings, in which.

DETAILED DESCRIPTION OF THE PREFERRED EMBODIMENTS OF THE INVENTION

Figure 1:
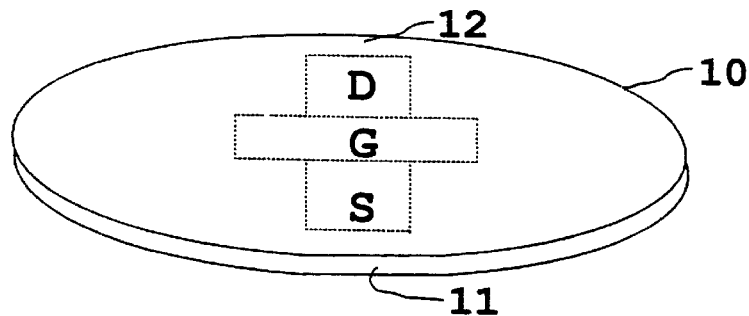
FIG. 1 is a perspective view of a prior art {100} silicon wafer showing a flat and with a FET illustrated on its surface with its gate width aligned with the flat and the [100] crystal direction.

Referring to FIG. 1 for a discussion of the present conventional or prior art fabrication process, a semiconductor wafer 10 is shown with a flat 11 to identify the crystal direction as {100}, which is identified by a dashed line 12 though the center of the wafer and perpendicular to the flat. To illustrate the alignment of a field effect transistor (FET) 13 with the [100] crystal direction, source, S, drain, D and gate, G elements of the FET are shown with the [100] crystal direction aligned perpendicular to the gate, which would make the channel, when voltage is applied to the gate, G, parallel with the [100] crystal direction.

Figure 2:
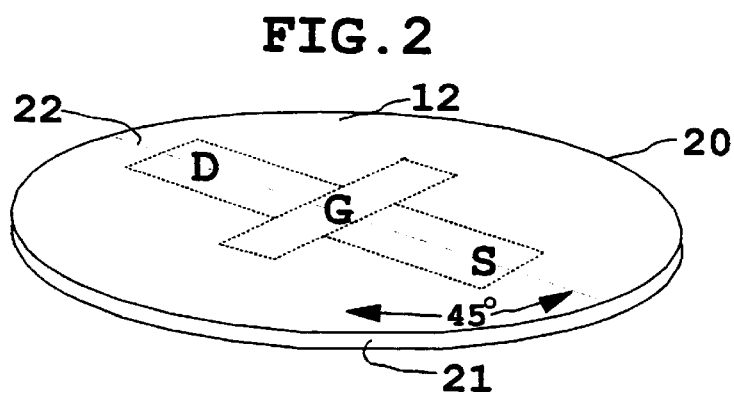
FIG. 2 is a perspective view of a {100} silicon wafer showing the flat but with the illustrated FET on its surface rotated forty-five degrees (45°) relative to the flat to align the gate width perpendicular to and hence the channel parallel with the [110] crystal direction.

In accordance with the present invention as embodied in FIG. 2, the relative relationship is rotated 45° between a conventional {100} wafer 20 and a mask (not shown) to which it is to be exposed. The wafer 20 contains a {100} orientation flat 21. Again for illustration purposes, the source, S, drain, D and gate, G elements of a FET are shown in FIG. 2 in a position 45° from the flat or along the [110] crystal direction, with the gate, G, aligned perpendicular to that crystal direction so that, when voltage is applied to the gate, the resultant channel will be parallel with [110] crystal orientation as identified by the dashed line 22. The dashed line 12 of the [100] crystal direction is also shown with the angle between the [100] direction and dashed line 22 of the [110] direction being identified as 45°.

Figure 3:
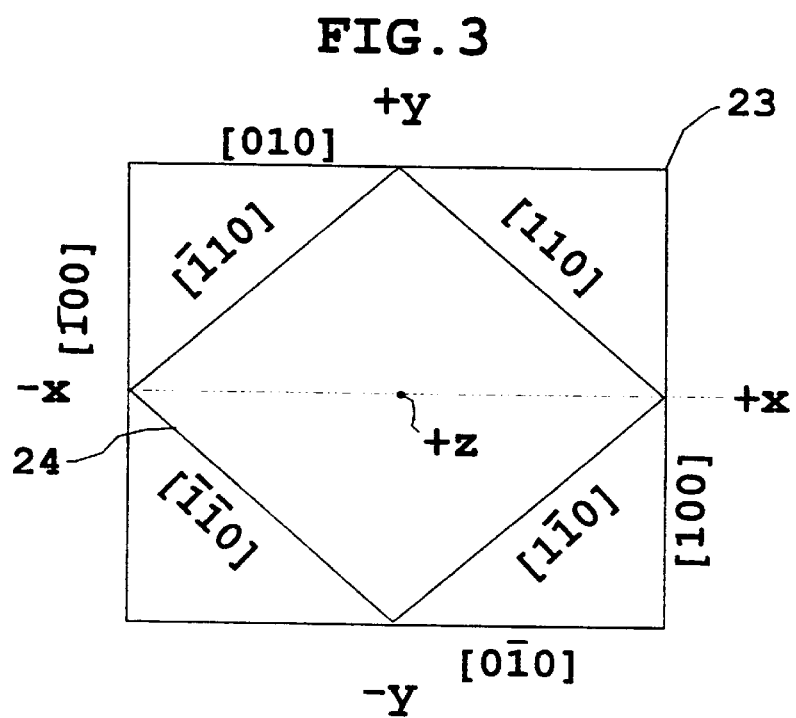
FIG. 3 is a plan view of two portions of a {100} silicon wafer superimposed with one portion offset from the other portion by 45° and showing a comparison the crystal directions of both portion except for those going into and out of the paper.

For the purposes of a more detailed explanation, FIG. 3 shows two superimposed portions 23 and 24 of a {100} silicon wafer. As a point of reference for comparing the crystal directions of the two portions, -x and +x axes and -y and +y axes dissect the two portions, with the +z axis being shown at the center of the two portions. The -z axis is under FIG. 3 and not shown. As can be seen from this Figure, negative and positive [100] crystal directions are parallel with the x and +x axes respectively, and negative and positive [010] crystal directions are parallel with the -y and +y axes, respectively. In contrast, portion 24, which is illustrative of the present invention, is offset from portion 23 by 45°. Its crystal directions are all [110] and are offset from either the x and y axes by 45°, the specific [110] direction depending upon the particular negative integer or integers as shown in FIG. 3.

Figure 4:
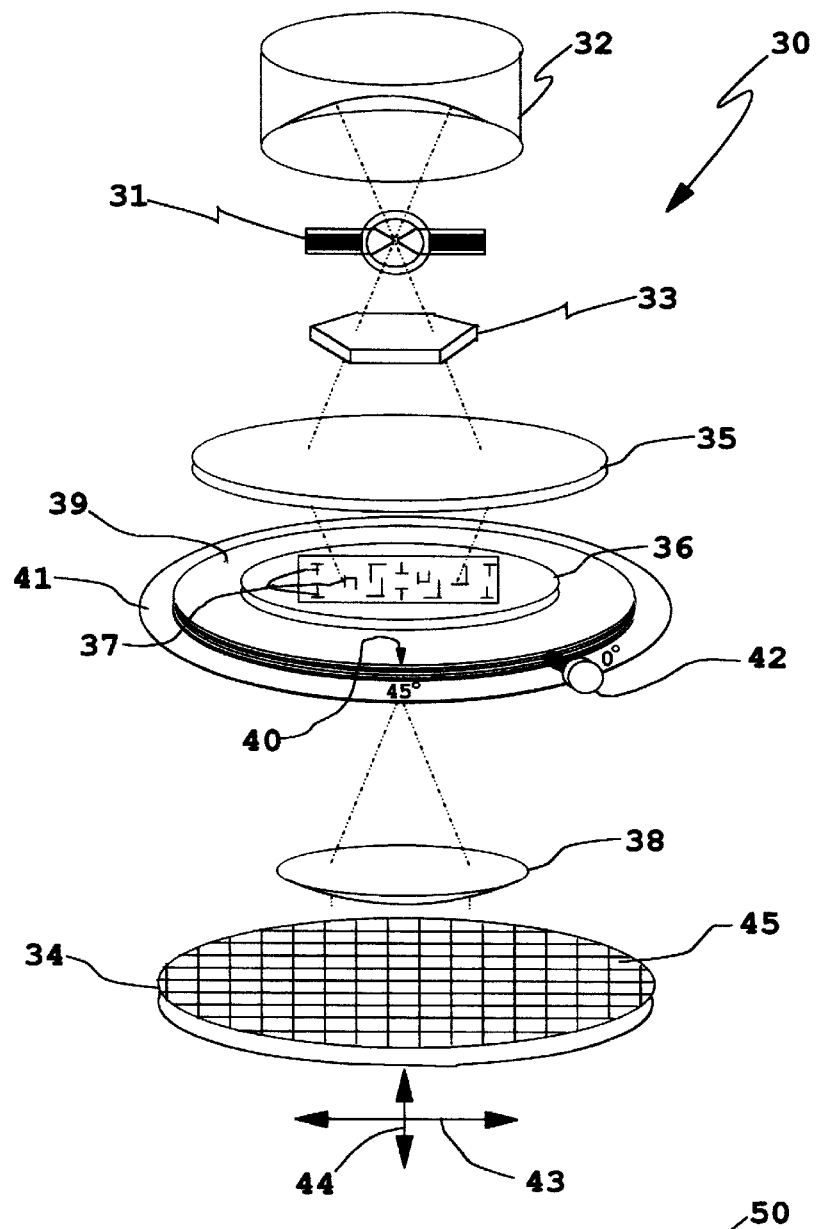
FIG. 4 is a perspective view of the components of lithographic system for exposing a resist coated wafer to an image.

With this explanation of crystal orientation and direction, FIG. 4 shows an illustrative embodiment of rotating the mask (not shown) forty-five degrees (45°) relative to the wafer 20. This is but one way of changing the relationship between the image to transferred to the wafer and the wafer. Conversely, the mask can remain stationary and the wafer 20 can be rotated 45°. In addition, if optical or x-ray lithography is used to transfer the image from a mask, the mask can be fabricated, such as by E-beam, so that the image is 45° from the conventional mask for the [100] direction or, preferably as will be described later, the image is fabricated with an image for [100] direction and the mask with this [100] direction image is rotated 45° before exposure so that the channel will be aligned parallel with the [110] crystal direction during exposure. Alternatively, if the transfer of the image is from a direct write E-beam, the processing software of the E-beam can be modified to write the image 45° from the [100] crystal direction so that the [110] direction is perpendicular to the gate. This, of course, would be the same as when an E-beam is used to fabricate a [110] direction mask as mentioned above. All of the above exposure processes normally require a resist material. However, if steered focused ion beam, similar to direct write E-beam but with positive ions, is utilized, a resist material would not be necessary.

Turning now to the preferred embodiment, which allows the use of the existing lithographic tools with only minor modifications, an optical lithographic exposure configuration 30 is shown is shown in FIG. 4. The configuration 30 includes a deep ultra violet light source 31, herein a mercury (Hg) arc lamp, whose emitted light is focused by a mirror 32 which then passes through a filter 33 to essentially block all of the wavelengths of the emitted light except those to which a resist (not shown) on a wafer 34 to be exposed is sensitive. The filtered light then passes through a condenser lens system 35 and through a mask 36 containing the images 37 to be transferred to the resist on the wafer after being reduced by a reduction lens system 38 before reaching the resist on the wafer 34.

In this embodiment, the mask 36 is mounted on a rotatable mask holder 39 with a precision mark 40. The rotatable mask holder is mounted for rotation on a stationary platform 41 calibrated with an detailed scale in degrees as exemplified by 45° and 0° on the upper surface of the stationary platform 41. A precision mechanism is depicted by the knob 42 whose clockwise and counterclockwise movement rotates the mask holder and with it the mask. Thus, with the mask mounted at 0° for exposing the {100} wafer, the knob 42 is turned clockwise to rotate the mask holder counterclockwise to the 45° position so that the images 37 in the mask are now aligned to expose the gate images perpendicular to the [110] crystal direction and thus align the channel approximately parallel to the [110] direction. This illustrated optical lithographic system 30 is a step and repeat system as shown diagrammatically by the arrows 43 and 44 perpendicular to each other. The image in the mask 37 is stepped across the wafer in both directions of the arrows 43 and 44 to repeatedly expose different portions of the resist (not shown) on the wafer 34 to the reduced image as shown by rectangles 45 on the wafer.

After the wafer has been processed through the other conventional processes in the fabrication of FET devices, the wafer is diced into individual dies or chips for mounting in a standard electronic package (not shown). Because the images are aligned with [110] crystal direction in the present invention instead of [100] crystal direction of the prior art, care must be taken in dicing the wafers because scribed {100} crystal oriented wafer prefers to break along [100] and [010] crystal directions. In the present invention, since the die or chip edges are along [110] directions, it is preferred to saw the {100} wafer through the scribe lines as exemplified by lines 46 (FIG. 4) of the wafer 34.

Figure 5:
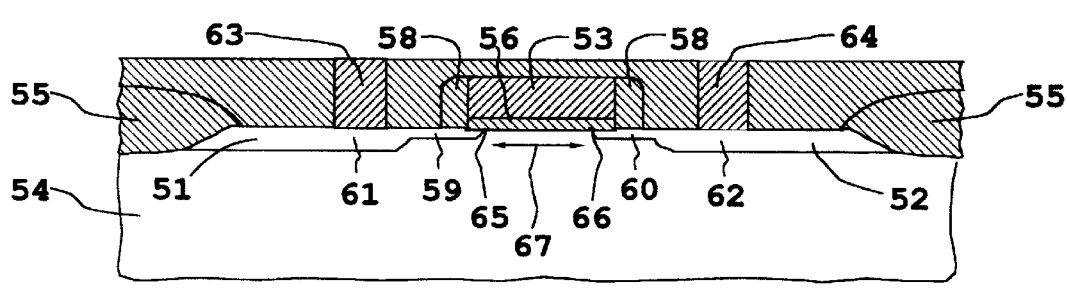
FIG. 5 is a cross-sectional view of an FET embodying the [110] crystal direction aligned perpendicular to the gate width and parallel to the channel when voltage is applied to the gate.

To further illustrate the relationship of the [110] crystal directions of the now silicon die or chip with the channel of an FET, an enlarged cross-section of an FET 50 with a source 51, a drain 52, and a gate 53 is shown in FIG. 5. The silicon body 54 of the wafer 34 (FIG. 3) is formed with isolating areas 55 which herein are silicon oxide grown in the silicon body 54 and are known as field oxide of the LOCOS type. In between the field oxide and grown on the surface of the silicon is a gate oxide 56 beneath and insulating the silicon body from a conductive gate 53 which preferably is polysilicon having been doped at some point in the fabrication process with an impurities to make it conductive. On the sides of the gate 53 are sidewalls 58 which are formed after a light dosage of impurity of the same type as the impurity used to dope the polysilicon gate. The light dosage of impurity creates a lightly doped source and drain regions 59 and 60 in the silicon body 54 which is commonly called a Lightly Doped Drain (LDD) type FET. The sidewalls 58 function as implant masks for a heavily dosage of impurities (of the same type but not necessarily the same chemical element or ion of impurity as the LDD), which form the other portions 61 and 62 of the source and drain. Conductive contacts 63 and 64 are formed to abut the source and drain portions 61 and 62, respectively, for applying a potential to both portions of the source 59, 61 and drain 60, 62. The gate 53 also is formed with a conductive contact (not shown in the cross section of FIG. 5) for applying a voltage to the gate. The silicon body 54 is doped with an impurity which is opposite in type to the impurities of the source, drain and gate. For example, if the impurity type in the source, drain and gate is N-type, the impurity type in the silicon body is P-type and the FET may called a NMOS. Conversely, if the impurities are reversed, the FET may called a PMOS. If a NMOS and a PMOS FETs are formed and connected to be complementary, the FET may be called a CMOS. Regardless of which type of FET it is, the channel is created between the inner edges 65 and 66 of the source and drain when a voltage is applied to the gate 53. In accordance with the present invention, the channel is aligned approximately parallel with the [110] crystal direction as shown by the double headed arrow 67 so as to take advantage of the higher drift velocity or mobility in [110] crystal direction for the majority carriers in the channel, whether they are electrons or holes. This permits the FET with a [110] crystal direction aligned channel to have a faster switching speed and thus a higher performance.

Although this invention has been described relative to specific materials, and lithographic systems for forming images on a wafer, it is not limited to the specific materials or systems but only to the specific characteristics required for the present invention. Other materials and apparatus can be substituted for those described herein which will be well understood by those skilled in the microelectronics and semiconductor arts after appreciating the present invention.

Having thus described the invention, what is claimed is:

1. A method of forming a field effect transistor (FET), having a source, drain and gate with the source and drain separated by a channel when voltage is applied to the gate, by a number of fabricating steps, including an exposure step, comprising:

positioning a {100} monocrystalline silicon wafer having a [100] crystal direction for exposing the wafer to images for fabricating at least one FET;

exposing said {100} wafer with the relationship of said wafer and said images being 45° from the [100] crystal direction and in a [110] crystal direction of said wafer; and performing non-exposure fabricating steps with said {100} wafer positioned in the [100] crystal direction, whereby the channel of the fabricated FET is aligned approximately parallel with the [110] crystal direction of said {100} wafer.

2. The method of claim 1 wherein said exposing step is to deep ultra violet radiation and said wafer carries a resist material sensitive to said radiation.

3. The method of claim 1 wherein said images are contained in a series of masks in a rotatable holder and the holder is rotated 45° to align the channel to be formed approximately parallel with [110] crystal direction in the {100} wafer.

4. The method of claim 1 wherein said images are contained in a series of masks and the {100} wafer is positioned in a rotatable holder and the holder is rotated 45° to align the channel to be formed approximately parallel with [110] crystal direction in the {100} wafer.

5. The method of claim 1 wherein said images are created by exposure of a resist by an electron beam with the beam controlled to write the images on the {100} wafer so that the channel to be formed will be approximately parallel with [110] crystal direction in the {100} wafer.

6. The method of claim 1 wherein said images are contained in an x-ray mask and the exposure of a resist on the {100} wafer is by x-rays.

7. A method of fabricating a field effect transistor (FET) comprising the steps of:

positioning a {100} monocrystalline silicon wafer having (100) and (110) crystal planes and [100] and [110] crystal directions for exposing the wafer to images for fabricating at a FET;

exposing said {100} wafer with the relationship of said wafer and said images being 45° from the [100] crystal direction and in the [110] crystal direction of said wafer to create a gate pattern having a gate width aligned in the [110] crystal direction;

positioning the {100} wafer in the [100] crystal direction for performing at least one non-exposure step in the [100] crystal direction; and completing the fabricating of the FET with a source and a drain and the gate with the source and drain separated by the gate width and a channel under the gate, whereby the channel of the fabricated FET is aligned approximately parallel with the [110] crystal direction of said {100} wafer.

8. The method of claim 7 wherein, before the {100} wafer is positioned for exposure, a silicon oxide layer is thermally grown in the silicon substrate and aligned with the [100] crystal direction.

9. The method of claim 7 wherein, after the {100} wafer is positioned in the [100] crystal direction, the source and the drain are formed while the wafer is in the [100] crystal direction.

10. The method of claim 7 wherein, after the gate pattern is created, the {100} wafer is rotated 45° for at least one of the following fabrication steps.

11. The method of claim 10 wherein lightly doped drains are formed in the {100} silicon wafer with the gate serving as an alignment mask as one of the following fabrication steps.

12. The method of claim 11 wherein sidewall spacers are formed on the gate as one of the following fabrication steps.

13. In a method of fabricating an integrated circuit with at least one field effect transistor (FET) comprising the steps of:

positioning a {100} monocrystalline silicon substrate having (100) and (110) crystal planes and [100] and [110] crystal directions for exposing the wafer to images for fabricating at least one FET;

thermally growing a silicon oxide layer in the silicon substrate and aligned with the [100] crystal direction;

creating a gate pattern having a gate width in the [110] crystal direction so that the gate width is aligned approximately orthogonal to the (110) crystal plane and parallel with the [110] crystal direction;

forming a source on one side of gate width and a drain on the other side of the gate width; and creating a channel under the gate between the source and drain aligned in a direction parallel with the [110] crystal direction of the gate width, whereby the performance of the FET is enhanced due to a higher mobility of the carriers in the [110] crystal direction and due to the high quality of the silicon oxide layer insulating the gate from the substrate by being disposed in the [100] crystal direction.

14. The method of claim 13 wherein the integrated circuit is fabricated with a plurality of field effect transistors.

15. The method of claim 13 wherein the gate pattern is created by exposing a layer of gate material to an image pattern and removing part of the gate material.

16. The method of claim 15 wherein, before creating the gate pattern, the {100} wafer is rotated 45° to position the wafer in the [110] crystal direction.

17. The method of claim 15 wherein, after creating the gate pattern, the {100} wafer is rotated 45° to position the wafer in the [100] crystal direction for at least one of the remaining fabrication steps.

18. The method of claim 17 wherein the source and the drain are formed while the {100} wafer is in the [100] crystal direction.

19. The method of claim 13 wherein, after the {100} wafer fabrication is complete, the wafer is diced into individual chips and the chip edges are along the [110] direction.

20. The method of claim 19 wherein the {100} wafer are sawed along scribe lines in the [110] direction at the chip edges.

* * * * *